(12) United States Patent
Schatzberger (10) Patent No.: US 8,059,020 B2
(45) Date of Patent: Nov. 15, 2011

(54) ADJUSTABLE ANALOGUE-DIGITAL CONVERTER ARRANGEMENT AND METHOD FOR ANALOGUE-TO-DIGITAL CONVERSION

(75) Inventor: Gregor Schatzberger, Graz (AT)

(73) Assignee: austriamicrosystems AG, Unterpremstätten (AT)

( * ) Notice: Subject to any disclaimer, the term of this patent is extended or adjusted under 35 U.S.C. 154(b) by 0 days.

(21) Appl. No.: 12/303,071

(22) PCT Filed: May 30, 2007

(86) PCT No.: PCT/EP2007/004790
§ 371 (c)(1),
(2), (4) Date: Jun. 24, 2009

(87) PCT Pub. No.: WO2007/137838
PCT Pub. Date: Dec. 6, 2007

(65) Prior Publication Data
US 2009/0267817 A1    Oct. 29, 2009

(30) Foreign Application Priority Data
May 30, 2006 (DE) .......................... 10 2006 025 116

(51) Int. Cl.
*H03M 1/62* (2006.01)
*H03M 1/84* (2006.01)
(52) U.S. Cl. ...................................... 341/138; 341/155
(58) Field of Classification Search ................. 341/155, 341/163, 139, 172, 138
See application file for complete search history.

(56) References Cited

U.S. PATENT DOCUMENTS 4,191,995 A * 3/1980 Farrow ............................. 700/37
4,271,392 A   6/1981 Outram et al.
4,831,381 A * 5/1989 Hester ............................ 341/172
(Continued)

FOREIGN PATENT DOCUMENTS
DE           37 90 072            1/1988
(Continued)

OTHER PUBLICATIONS

R.K. Hester et al, "Fully Differential ADC with Rail-to-Rail Common-Mode Range and Nonlinear Capacitor Compensation", IEEE Journal of Solid-State Circuits, IEEE Service Center, vol. 25, No. 1, pp. 173-182, Feb. 1, 1990.

*Primary Examiner* — Peguy JeanPierre
(74) *Attorney, Agent, or Firm* — Cozen O'Connor (57) ABSTRACT

An adjustable analog-digital converter arrangement comprising: an input adapted for receiving an input signal; an analog-digital converter operating by successive approximation, having a signal input coupled with the input, wherein said converter is adapted for converting an analog signal at the signal input into a digital value; an attenuator with an output, wherein an input of said attenuator is coupled to the signal input and is adapted for an amplitude change of signals applied to its input, wherein the amplitude change is controllable by means of a control input, and wherein the attenuator comprises switchable capacitors and forms a part of a first stage of said analog-digital converter; a control circuit having an output coupled to the control input of the attenuator and adapted to initialize, as a function of a comparison of a signal output by the analog-digital converter with a threshold, an automatic adjustment of the attenuation by generating a control signal, and having an output for the output of the control signal that is coupled to the attenuator.

25 Claims, 6 Drawing Sheets

U.S. PATENT DOCUMENTS

| | | | |
|---|---|---|---|
| 4,859,964 A | 8/1989 | Jorgensen | |
| 5,028,893 A * | 7/1991 | Marrah et al. | 333/173 |
| 5,355,257 A * | 10/1994 | Lokhoff et al. | 360/32 |
| 5,581,252 A | 12/1996 | Thomas | |
| 5,796,300 A * | 8/1998 | Morgan | 330/9 |
| 5,861,831 A | 1/1999 | Murden et al. | |
| 6,424,221 B1 | 7/2002 | Korn | |
| 6,633,273 B2 | 10/2003 | Ikeda et al. | |
| 6,657,570 B1 * | 12/2003 | Chiappetta | 341/120 |
| 6,674,327 B2 | 1/2004 | Harbets | |
| 6,674,386 B2 | 1/2004 | Carreau et al. | |
| 6,731,232 B1 | 5/2004 | Kearney | |
| 6,940,445 B2 * | 9/2005 | Kearney | 341/163 |
| 7,038,609 B1 * | 5/2006 | Hurrell | 341/156 |
| 7,167,515 B2 * | 1/2007 | Kelly et al. | 375/229 |
| 7,268,715 B2 * | 9/2007 | Guimaraes | 341/143 |
| 7,432,844 B2 | 10/2008 | Mueck et al. | |
| 7,672,359 B2 * | 3/2010 | Cleary et al. | 375/147 |
| 2003/0231130 A1 | 12/2003 | Confalonieri et al. | |
| 2005/0200510 A1 | 9/2005 | Yoshida et al. | |
| 2006/0158365 A1 | 7/2006 | Kernahan et al. | |
| 2008/0198056 A1 | 8/2008 | Hurrell | |
| 2010/0060500 A1 | 3/2010 | Schatzberger et al. | |

FOREIGN PATENT DOCUMENTS

| | | |
|---|---|---|
| EP | 1 093 229 | 4/2001 |
| EP | 1 569 346 | 8/2005 |
| WO | WO 2005/096503 | 10/2005 |

* cited by examiner

Prior Art

ADJUSTABLE ANALOGUE-DIGITAL CONVERTER ARRANGEMENT AND METHOD FOR ANALOGUE-TO-DIGITAL CONVERSION

RELATED APPLICATIONS

This is a U.S. national stage under 35 USC §371 of application No. PCT/EP2007/004790, filed on May 30, 2007.

This application claims the priority of German application no. 10 2006 025 116.4 filed May 30, 2006 the entire content of which is hereby incorporated by reference.

FIELD OF THE INVENTION

The invention relates to an adjustable analog-digital converter arrangement and also to a method for the conversion of an analog input signal into a digital signal.

BACKGROUND OF THE INVENTION

Analog-digital converters (A/D converters) are used in integrated circuits for the conversion of analog input signals into digital values. The clocked converters sample the input signal at different times and generate digital values from these samples. For input signals at high levels in the range of several tens of volts, these converters should be manufactured using special production techniques, for example, in a multi-film oxide CMOS process. Analog-digital converters produced in this way are also suitable for signals with exceptionally high input levels in contrast to converters using conventional production technology. Conventional converters could overload at high input signal levels and thus deliver false values or could even be damaged. However, one disadvantage of this multi-film oxide CMOS converter is that the high withstand voltage is achieved only at the expense of space requirements and the conversion rate.

One alternative to the voltage-resistant analog-digital converters consists in attenuating the input signal by a defined factor and feeding the attenuated signal to a conventional analog-digital converter arrangement. The A/D converter contained in this conventional converter arrangement then can be produced using CMOS technology and has low space requirements with a simultaneously high conversion rate. The attenuation of the input signal by a constant factor, however, can lead to problems for input signals with low levels. These are attenuated again so that error during the analog-digital conversion is amplified due to inherent noise within the converter. Under some circumstances, the attenuation can have the result that the level of the supplied, attenuated input signal is smaller than a quantization step of the A/D converter. In other words, the constant attenuation limits the resolving power of the converter for low input signals.

Figure 9:
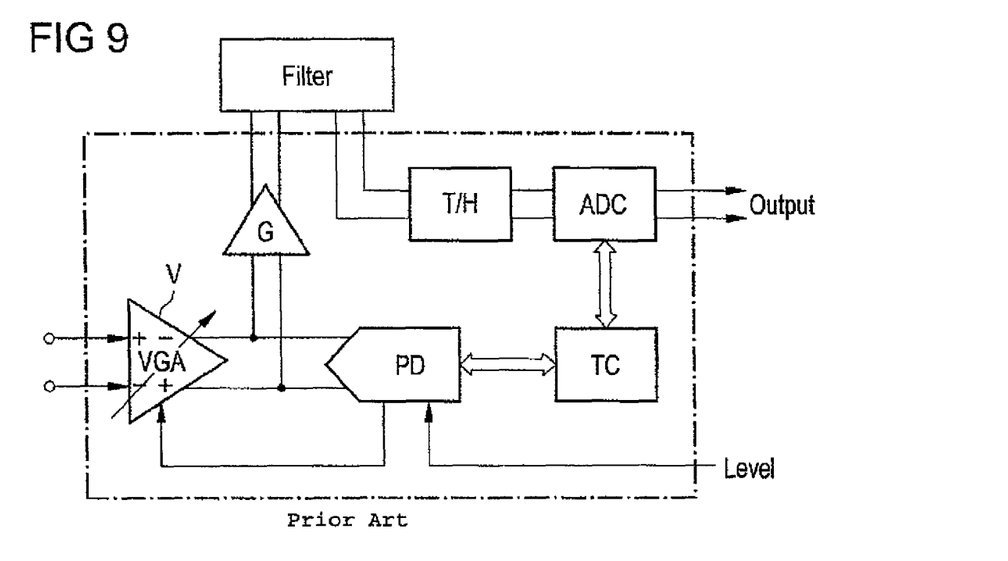
FIG. 9 construction of a known analog-digital converter arrangement.

The publication U.S. Pat. No. 5,861,831 and FIG. 9 show a converter arrangement with an active circuit for attenuating an input signal. The arrangement of an active circuit shown in FIG. 9 is realized by an adjustable amplifier V. This is connected to the input of the converter ADC by means of a filter. The amplification factor is set here by a level detector PD to which the signal output by the amplifier is fed. Another level control signal allows a desired setting of the detector PD. Furthermore, a time circuit TC is provided that controls both the actual A/D converter ADC and also the peak detector PD. The signal output by the amplifier V is fed via a filter to the A/D converter ADC. The detection of signal changes in the input signal is limited by the bandwidth of the peak detector PD. The illustrated converter is suitable primarily for converting intermediate frequency signals. In addition, due to the additional level detector PD, the current consumption of the entire arrangement is increased.

SUMMARY OF THE INVENTION

One object of the invention is to provide an analog-digital converter arrangement that has a high input signal range with simultaneously low current consumption. Another object of the invention is to provide a method for analog-digital conversion that converts signals with a high level range into digital values by simple means.

One aspect of the present invention is directed to an adjustable analog-digital converter arrangement comprising: an input adapted for receiving an input signal; an analog-digital converter operating by successive approximation, having a signal input coupled with the input, wherein said converter is adapted for converting an analog signal at the signal input into a digital value; an attenuator with an output, wherein an input of said attenuator is coupled to the signal input and is adapted for an amplitude change of signals applied to its input, wherein the amplitude change is controllable by means of a control input, and wherein the attenuator comprises switchable capacitors and forms a part of a first stage of said analog-digital converter; a control circuit having an output coupled to the control input of the attenuator and adapted to initialize, as a function of a comparison of a signal output by the analog-digital converter with a threshold, an automatic adjustment of the attenuation by generating a control signal, and having an output for the output of the control signal that is coupled to the attenuator One embodiment uses the analog-digital converter itself as a measurement device for the detection of the input signal range or the maximum level occurring in the input signal. Therefore, the bandwidth for the detection of signal changes is still limited only by the A/D converter that is used and that also processes the input signal itself. In one configuration of the invention, the arrangement comprises an analog-digital converter with an input for feeding an analog input signal and also an output for discharging a digital output signal. Connected to this output is an evaluation circuit that evaluates the output signal output by the converter and, as a function of the signal output, outputs a control signal to a controllable attenuator connected before the converter.

The attenuator comprises a switchable capacitance array that can have, for example, several switchable capacitors or charge accumulators that divide the input voltage proportionally to their capacitance values. Simultaneously, the attenuator is constructed as part of the first stage of the converter that operates by successive approximation.

In this way the capacitance values of individual capacitors in the capacitance array can be equal or different, in particular, binary weighted. Binary weighting is understood to mean a difference by a factor of 2. This embodiment is suitable especially for high-voltage applications in which the input signal level can assume especially high voltage values in the range of a few tens of volts.

With the help of the evaluation circuit, first, an "overflow" of the analog-digital converter and, second, a signal level in the input signal that is too low due to the provided attenuation can be determined. Through the evaluation of the output signal of the analog-digital converter, an overload in the analog-digital converter due to attenuation that is too low can be recognized in due time. Likewise, the attenuation behavior of the attenuator can be reduced when the average input level of the signal fed to the analog-digital converter is low. In this way, the analog-digital converter can always be operated in the region of its greatest resolution and thus greatest sensitivity.

In one improvement, the analog-digital converter comprises one output for outputting a signal that directly displays an overload of the analog-digital converter. In one construction of the invention, this output is coupled with the control device for the output of the control signal to the attenuator. Therefore, if the analog-digital converter is overloaded, the attenuation behavior of the attenuator can be quickly changed without resulting in damage.

It is likewise possible to construct the attenuator with a controllable amplifier. Therefore, the input signal can be both attenuated and also amplified in its level. With this construction, a converter arrangement can be realized with a very high dynamic level range for the input signal.

The evaluation circuit allows both a change in the attenuation to be performed automatically, for example, by the detection of an overload signal, and also a change to be triggered manually. Here, in one configuration of the invention, the input signal is sampled over time by the analog-digital converter and the maximum value is determined. With the help of this value, the attenuator can be set so that the analog-digital converter is optimally controlled. For example, the sampled maximum value can be compared to the maximum processing value of the analog-digital converter. The difference is used for generating the control signal for the attenuation factor of the attenuator.

During this process, it is provided in one implementation of the invention that the control circuit outputs a corresponding signal for displaying the setting routine. For example, other circuits are informed not to continue processing the values output by the converter arrangement due to the possibility of incorrect analog-digital conversion.

BRIEF DESCRIPTION OF THE DRAWINGS

Below, the invention will be explained in detail using several embodiments with reference to the drawings. Shown are.

DETAILED DESCRIPTION OF THE DRAWINGS

Figure 1:
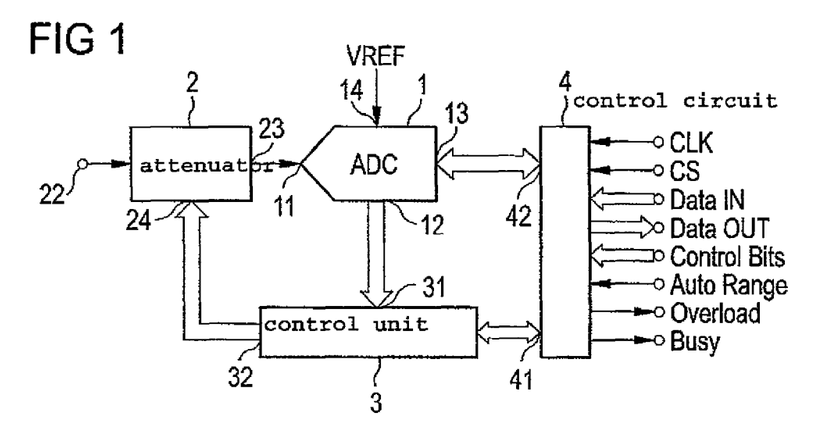
FIG. 1 shows a first embodiment of an analog-digital converter arrangement.

FIG. 1 shows an A/D converter arrangement with an automatic setting for the level range of the input signal for optimal control of the converter. The converter arrangement comprises a signal input 22 to which an analog input voltage signal can be fed. An attenuator 2 that can be adjusted in its attenuation factor is coupled with the signal input 22. It contains a control input 24 for feeding a control signal that sets the attenuation factor. At its output 23, the attenuator 2 outputs an output signal attenuated by the corresponding factor and derived from the input signal. The output 23 is connected to an input 11 of an analog-digital converter 1 (A/D converter). The A/D converter 1 can be constructed as a converter that operates with successive approximation. In present case, it is constructed as a clocked converter. It samples the level of the input signal in several stages arranged one after the other and determines a digital value corresponding to the analog input signal from the results of the individual stages. For this purpose it comprises a digital interface 13 that is coupled with a monitoring circuit 4. Via this interface, it obtains, among other things, the clock signal CLK for the sampling process and also optionally the additional control signal Data IN. An additional input 14 is used for feeding a reference voltage $V_{ref}$.

During operation, the A/D converter 1 outputs the analog signal applied to its input and converted into a digital value at the digital interface 13 to the control device 4. The monitoring circuit 4 comprises several inputs, among other things, for a clock signal CLK and various control bits as well as other control signals CS and Auto Range. The control bits are digital signals used to adjust or set the converter into different operation modes. For example, some control bits may activate the overall device while others may activate or deactivate sub-circuits not used in some specific modes of operation. No further details are deemed necessary because such control bits are well known to any person with ordinary skill in the art. Additional signals that characterize special operating states of the analog-digital converter are given by the signals "Overload" and "Busy." The conversion result is provided as a digital data word Data OUT from the monitoring circuit 4.

Now if the level of an input signal at the input 11 exceeds a certain threshold, the A/D converter 1 is overloaded. This can be the case, for example, if the level of the input signal exceeds the maximum processing level of the converter. This leads to incorrect conversion and an output of an incorrect value.

For displaying such an overload, the analog-digital converter 1 includes an overload output 12 that provides a signal indicating the overload. The output 12 is connected to an input 31 of an automatic control unit 3. The control unit 3 is coupled via another interface to an interface 41 of the monitoring circuit 4. The output of the control circuit 3 is connected to the control input 24 of the attenuator 2.

For activating the operating mode in which the converter arrangement according to the invention performs the setting of the attenuator 2, there are several possibilities. On one hand, this can take place directly by means of the A/D converter that outputs a signal at the output 12 to the control circuit 3 when there is an overload. The control circuit 3 automatically changes the attenuation factor by a predefined value, in order to prevent further overload or damage to the converter. On the other hand, this can also be triggered manually by means of the signal "Auto Range" at the interface of the monitoring circuit 4. This is significant especially when, for example, it is foreseeable that the level range of the signal at the input 22 of the converter will change considerably. If the control circuit 3 then changes the attenuator, this is indicated by the signal "Busy" on the output of the monitoring circuit 4.

A third possibility is to evaluate the digital values output by the A/D converter 1. If these are especially small, then the sensitivity of the A/D converter can be increased through a corresponding reduction of the attenuation factor in the attenuator 2. The accuracy of the conversion is increased because the input signal now uses the entire processing range of the converter. The control circuit 3 takes over the setting of the attenuation on the attenuator 2.

A third possibility is to evaluate the digital values output by the A/D converter 1. If these are especially small, then the sensitivity of the A/D converter can be increased through a corresponding reduction of the attenuation factor in the attenuator 2. The accuracy of the conversion is increased because the input signal now uses the entire processing range of the converter. The control unit 3 takes over the setting of the attenuation on the attenuator 2.

Figure 7:
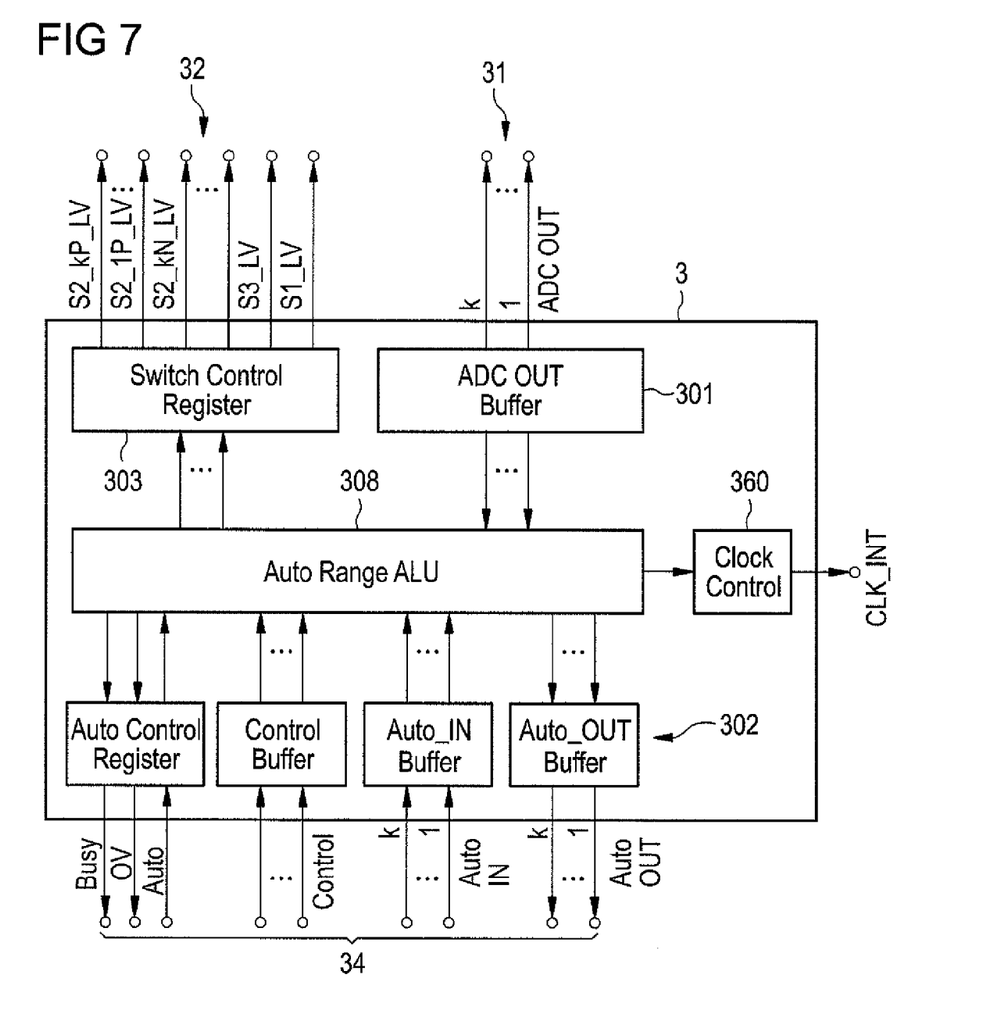
FIG. 7 shows an embodiment from a partial region of the control circuit.

FIG. 7 shows a possible embodiment of the control circuit. Components with identical action or function carry identical reference symbols. The control circuit 3 comprises, in turn, several sub-elements constructed as integrated circuits. A first memory and logic unit 301 processes the k-bit output word ADC OUT supplied by the A/D converter 1 and buffers this word in a buffer. Then a suitable evaluation can be performed. For example, it can be preferable to perform a resetting of the attenuator not for a single indicated overload, but instead only for an overload that exceeds a defined longer time period. The evaluation is performed by the logic unit 301.

In the same way, the memory and logic circuits 302 process all of the information coming from the control circuit on the interface 34. The circuits 302 can be combined into other groups. The groups Auto_OUT and Auto_IN are buffer circuits for buffering the data words "AutoOUT" and "AutoIN." In addition, there are buffer circuits "Control Buffer" and "Auto Control Register" for the control signals "Control" and "Auto," "OV," as well as "Busy." For manual activation of a setting process, the control signals "Control," but also "Auto" can be used.

In addition, after a successful readjustment of the monitoring circuit 4, the logic element 302 transmits the new attenuation factor with the word Auto_OUT. The monitoring circuit 4 can then take this new attenuation factor into account for the recalculation of the digital values. In addition, the logic element 302 also outputs the overload signal "Overload" or OV and also a busy signal "Busy" to the monitoring circuit 4. The latter indicates that an adjustment process is being performed. Due to the busy signal "Busy" of the control circuit 3, the monitoring circuit 4 is in the position to evaluate the digital values coming from the A/D converter 1 as invalid.

The control circuit 3 further comprises a clock generator 360 and also additional control circuits 308 or "Auto Range ALU" for processing the overload signal and also the data transmitted from the monitoring circuit 4 to the individual buffer of the element 302. From the various sets of information, the control circuit 3 generates control information that is output from the circuit "Auto Range ALU" to the register "Switch Control Register" 303. This buffers it and generates the control signals S1_LV to S2_kP_LV. With the control signals, the new attenuation factor in the attenuator 2 is set.

Figure 8:
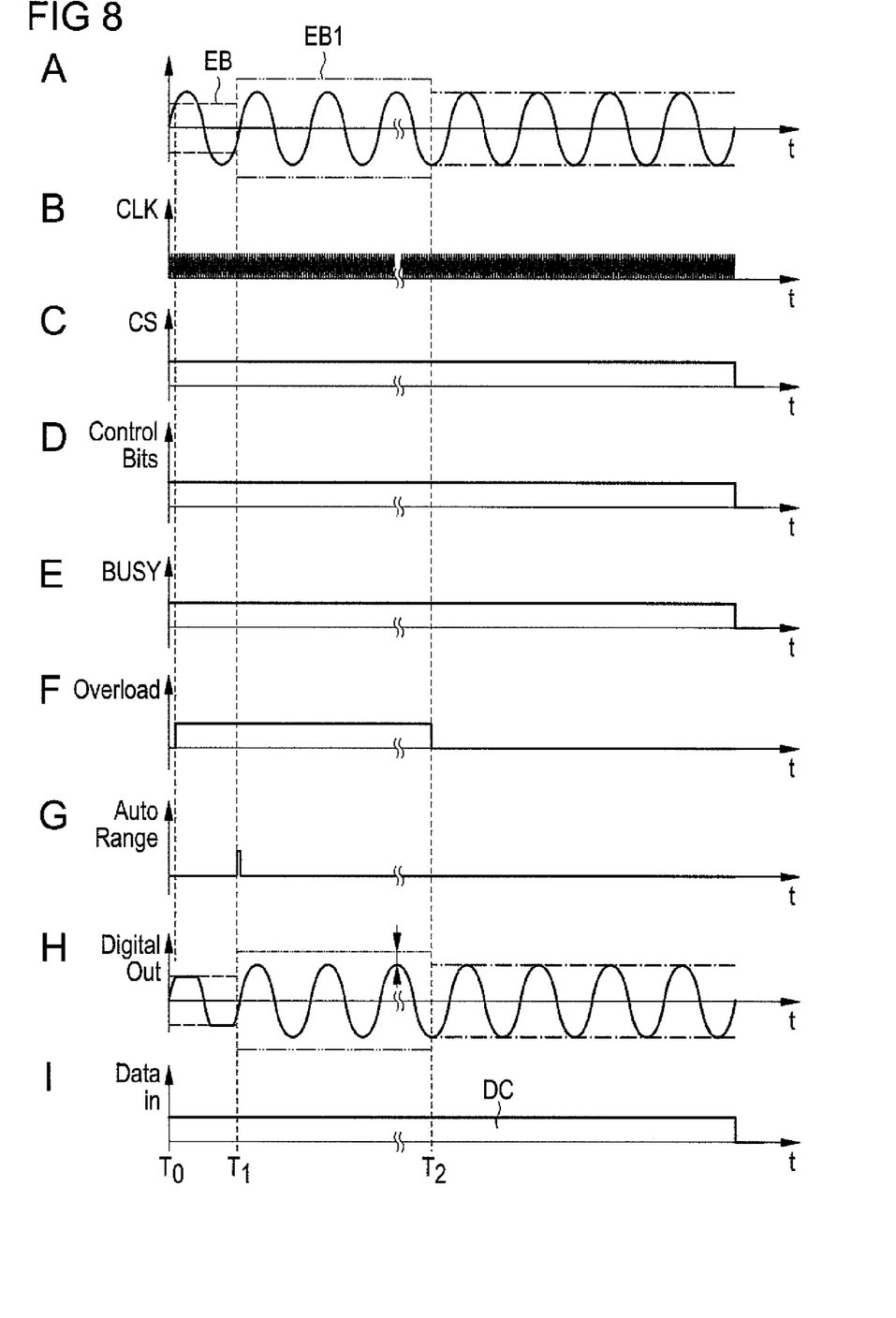
FIG. 8 shows a timing chart for different signals during a setting process.

FIG. 8 shows a timing chart for various signals during an adjustment process of the attenuator. In this embodiment, an adjustment is performed after an activation of the arrangement according to the invention. The analog input signal on the input of the A/D converter 1 initially exceeds the permissible processing range of the converter during the time T0-T1, so that the converter 1 generates an overload signal at its output 12.

In the figure part A, the sinusoidal analog input signal is shown. Figure part B shows the clock signal CLK for sampling the input signal in the converter. A control signal CS that activates the converter for the range setting is seen in figure part C. Several control bits "Control Bits" for adjustments of the converter are similarly transmitted during this time. This is indicated in figure part D. Figure part E shows the signal "Busy" that indicates that the converter is performing a range setting and that the data words output by it are possibly incorrect. The signal "Overload" in figure part F is applied for the time period in which the range adjustment of the converter is not yet completed. Finally, the digitized output signal "Digital OUT" is shown in figure part H; in figure part I, an input data stream "Data IN" is shown.

Up to the time period T1, the range for the input signal processing of the A/D converter 1 is smaller than the amplitude of the analog input signal. Therefore, the analog-digital converter is overloaded during this time and error-free conversion is not guaranteed. Starting at the time period at which the analog input signal exceeds the permissible input range of the converter, the signal "Overload" in figure part F is generated by the converter and output to the monitoring circuit 4. This forwards the signal to its output, so that the overload is also indicated to other circuits. Output is performed up to time point T2 starting at which the attenuator is set with its factor so that the signal level optimally uses the processing range of the converter.

At time point T1, according to figure part G the signal Auto-Range is generated for activating the adjustment of the attenuator. This has the result that the attenuator is now operated at its greatest attenuation factor. Conversely, this means that this lies completely in the input signal range of the converter due to the attenuated signal level. As shown in figure part A, if one starts at each time point from a normalized input signal level, this means an increase in the input signal range of the converter. During the time period now following from T1 up to the time point T2, the converter samples the input signal and determines a maximum level.

The difference between the maximum input signal range of the converter and the maximum level produces a value by which the attenuation factor of the attenuator 2 can be changed. Therefore, the signal level at the input of the converter is increased again and uses the complete input signal range. The switch-over process to the optimal range is completed at time point T2. Then the output of the signal "Overload" by the monitoring circuit 4 is also completed. At the time point T2, the data output by the analog-digital converter can be further processed again.

In addition to the embodiment shown here in which, for a corresponding overflow signal, the attenuation factor is set to its maximum value and is then changed to the optimal value, it is also possible to increase the attenuation step by step. For example, an adjustment of the respective optimum attenuation factors can be performed incrementally or by means of an iterative approximation. In addition, it is preferred to operate the attenuator with its maximum attenuation factor just after activation of the converter arrangement and to simultaneously switch into the adjusting mode. Thus, overload or damage is avoided. The analog-digital converter now outputs digital values at its output from which a maximum value can be easily determined. Therefore, at the beginning of each measurement, an automatic calibration of the converter to its optimum range can be performed. The automatic adjustment with the help of the signal "Auto Range" allows an independent decision to be made on a range adjustment in the converter itself, without additional measures or controls of external devices. Thus, for example, the signal "Overload" can be led on the signal "Autorange" so that the overload signal "Overload" initiates an automatic range adjustment.

Figure 2:
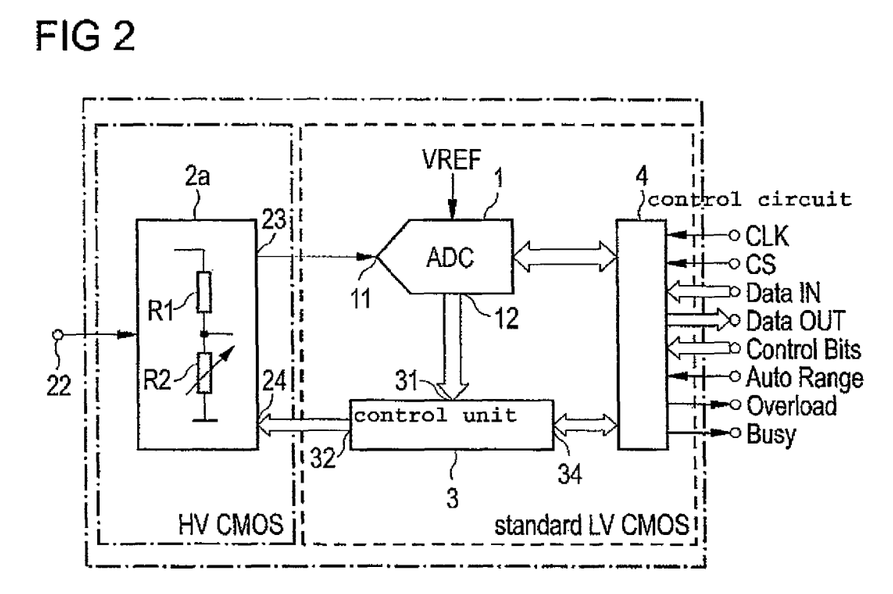
FIG. 2 shows a second embodiment of an analog-digital converter arrangement.

FIG. 2 shows another configuration of the analog-digital converter arrangement for applications in the range of multiples of 10 V. Components with identical action or function carry identical reference symbols. In this construction, the converter is produced with different processing technologies. The attenuator 2*a* in the form of a programmable resistance divider is realized in one area of the A/D converter arrangement as an integrated circuit in a multi-film oxide HV CMOS process. Therefore, a high withstand voltage of the resistance divider is produced even at very high input voltages. Due to the resistance division, a corresponding stepped-down voltage signal is output at the output 23.

The second area of the A/D converter arrangement according to the invention is realized as an integrated circuit in a standard LV CMOS process. Space and power consumption are low for simultaneously high resolving power and high sampling rate. Between the output 32 of the control circuit 3 and the corresponding control input 24 of the programmable resistance divider 2a in the high-voltage area, special level shifters (not shown) are provided. Level shifters are needed because different voltages are used to drive and operate divider 2a and control circuit 3. The latter is implemented in low voltage CMOS technology and may not generate high voltage signals. Accordingly, level shifters are provided to convert low voltage control signals of control circuit 3 to high voltage signals. Such level shifters are commonly used when combining low voltage and high voltage technologies. The level shifters are suitable for controlling switches provided in the programmable resistance divider with high voltages, wherein the high voltages are generated from the control signal output by the control circuit 3.

In the arrangement it is preferred that the resistance divider 2a has its greatest value after activation of the converter. In this connection, one assumes that the resistance divider 2a is switched into its highest range. Therefore, overload and possible damage to the converter 1 is prevented even at high input voltage values. After activation, through a corresponding control signal "Auto-Range" the setting operation mode is initiated in the monitoring circuit 4 and the control circuit 3. The converter now samples the attenuated signal applied to its input 22 for a predetermined time period, transmits the values to the control circuit 3 and the monitoring circuit 4, whereupon these determine the attenuation necessary for the optimum operation. The division ratio of the resistance divider in the attenuator 2a is then readjusted.

At a later time point, if the signal level at the input 11 of the converter exceeds the input processing range, the converter generates an overload signal "Overload" on the overload output 12, whereupon the setting routine is initiated again and the control circuit 3 adjusts the attenuation factor accordingly.

Figure 3:
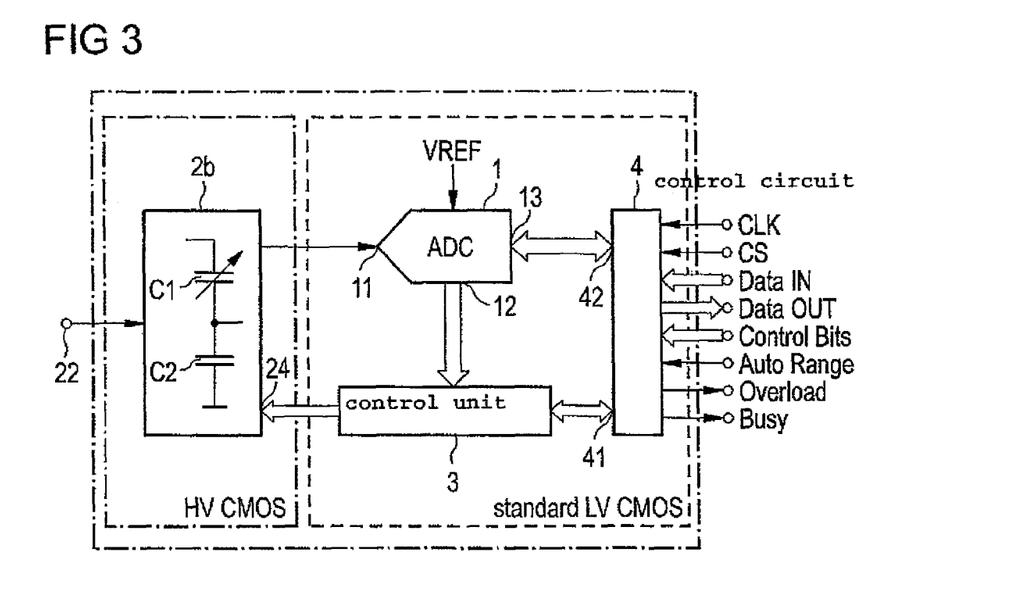
FIG. 3 shows a third embodiment of an analog-digital converter arrangement.

FIG. 3 shows a similar embodiment in which the attenuator 2b is constructed as a programmable capacitance-based divider in the HV CMOS area. The individual capacitors, of which two C1, C2 are shown schematically, are also produced here in a process that is suitable for high-voltage applications. The control and also the switching on and off of individual capacitors takes place by means of the control signal 24. The analog voltage applied at the input 22 is divided by the capacitors in the ratio of the capacitor circuit.

Figure 4:
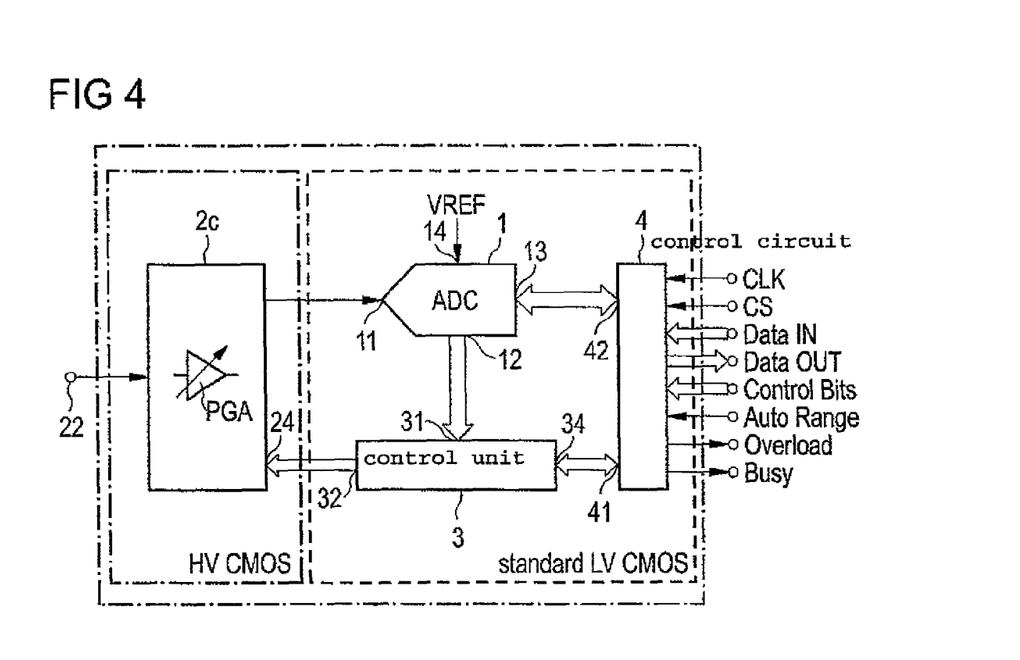
FIG. 4 shows a fourth embodiment of an analog-digital converter arrangement.

FIG. 4 shows another alternative with a programmable amplifier 2c. With the help of the programmable amplifier, it is also possible, in addition to attenuating the input signal at high input levels, to amplify input signals with low levels accordingly. Therefore, the level range of the input signal is increased again at the input 22. The converter shown in FIG. 4 is suitable for processing input signals with very high voltages just like signals with very low voltages.

Figure 5:
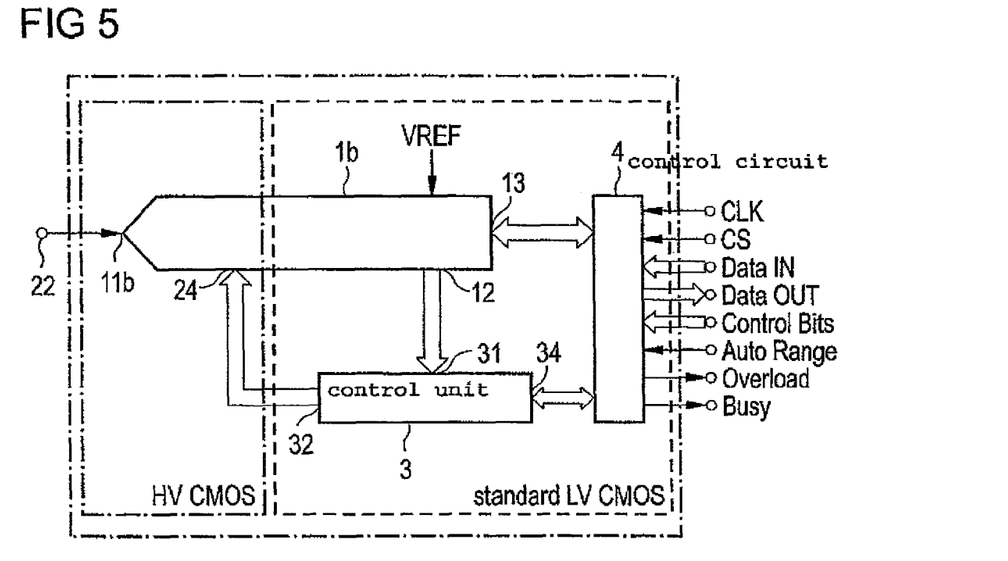
FIG. 5 shows an embodiment of the invention.

FIG. 5 shows one possible realization of the invention based on an analog-digital converter that operates with successive approximation. In such converters, the attenuator for the input signal can be formed as a component of the sampling unit of the converter. Therefore, a part of the converter is formed in standardized CMOS processing technology for low voltages. The first stage is formed at least partially in a process for high-voltage applications. The switchable capacitors of the first stage are used during the sampling phase as part of the sample/hold circuit. During the later hold phase, they act as digital-analog converters for generating the output signal. Special capacitors, for example, poly 1/poly 2 capacitors or also certain metal-metal capacitors bear voltages up to 25 V, depending on the oxide thickness between the individual capacitor plates. Consequently it is sufficient, above all, to design the switch for the sampling phase as a high voltage-resistant element.

In addition there are two possibilities for constructing the attenuator in a first stage of such a converter. First, it is possible to attach a separate programmable capacitance array at the convergence point of the first stage of the analog-digital converter. The switchable capacitor array operates like a programmable capacitance divider in combination with the capacitors of the first stage. An input signal is attenuated according to the selected divider ratio.

A second possibility for realizing the attenuator consists in adding additional capacitance to the capacitors of the first stage, in order to attenuate the input signal. The additional stages of the analog-digital converter are realized in a conventional way.

Figure 6:
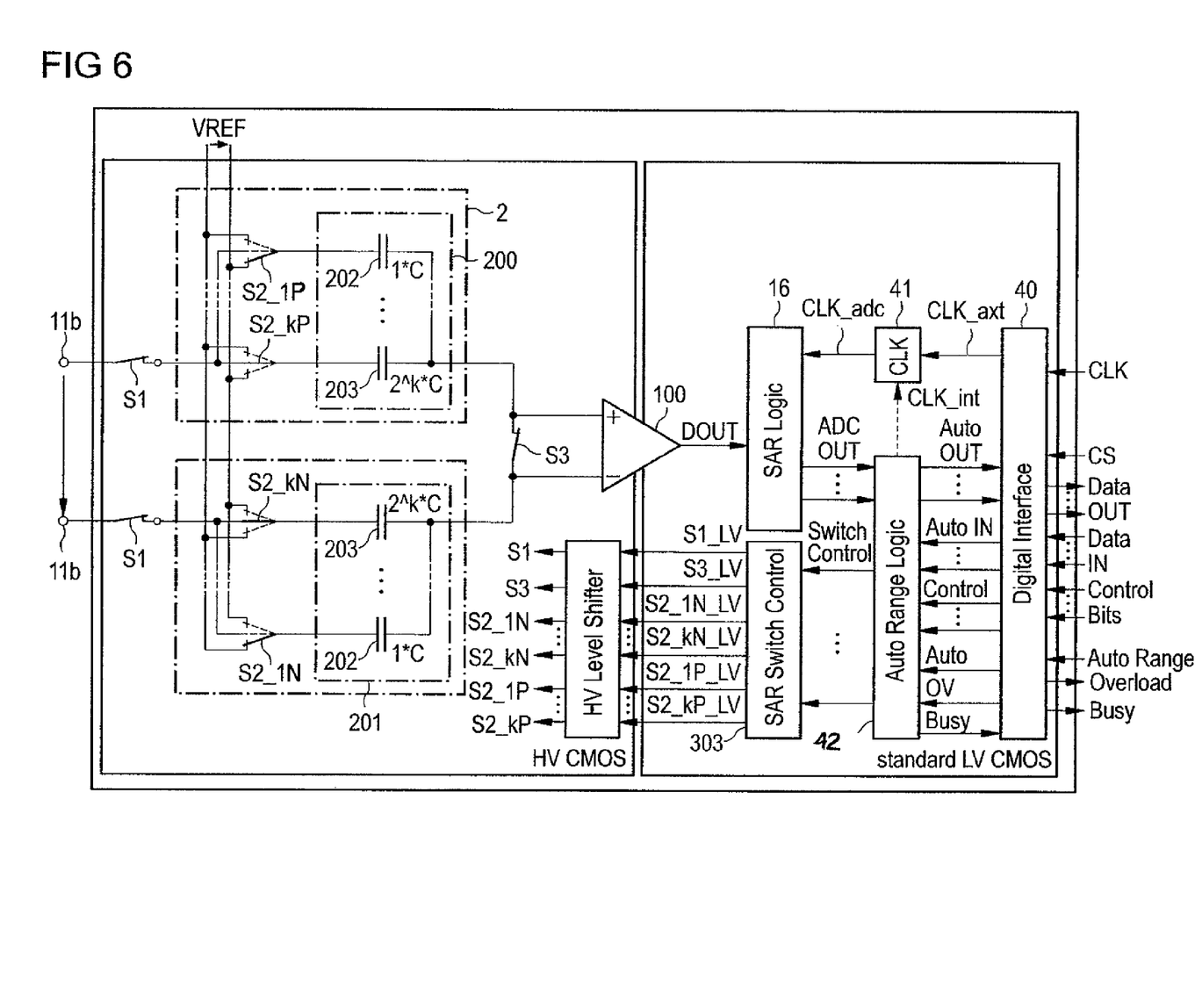
FIG. 6 shows a detailed diagram of the construction according to FIG. 5.

FIG. 6 shows a detailed embodiment of an analog-digital converter arrangement with successive approximation that is suitable for high-voltage applications and comprises a capacitive attenuator 2. In a first subregion "standard LV-CMOS," the monitoring and control circuits 40-42 are constructed using low-voltage CMOS technology. A digital interface 40 is used for providing various signals of the analog-digital converter. Among other things, these signals include the output data word "Data Out" that indicates the digital value of the analog input signal. With the signals "Overflow" and "Busy," an overload of the analog-digital converter and also the time are displayed, while the converter performs a range adjustment of its control range. Through the signal "Auto Range" the converter according to the invention is triggered for a range adjustment of its control range. Additional monitoring and control bits "Control Bits," "Data In," and "CS" are used for feeding control signals for setting additional parameters.

The analog-digital converter is also supplied with an external clock signal CLK. Internally, the digital interface 40 is connected to control logic for range adjustment, the "Auto Range Logic" 42, which substantially corresponds to control circuit 3. As a function of the operating mode, the externally or internally generated clock signal is guided from the clock generator 41 on the line "CLK_adc." If the arrangement is located in the range adjustment mode, an internal clock signal generated by the clock generator 41 is used. In the standard operating mode, the external clock signal is used. This is fed to the "SAR Logic" circuits 16 for the successive approximation of the converter. The additional signals coming from the digital interface 40 are forwarded to the "Auto Range Logic" 42. This further processes, on one hand, the output signal "ADC OUT" coming from the circuits "SAR Logic" 16 or 1b for the successive approximation or generates the control signals "Switch Control" for the control circuit 303.

In the high-voltage area "HV CMOS" of the converter according to the invention there is a capacitive attenuator 2 that attenuates the analog difference signal applied to the input terminals 11b and passes it to a comparator 100. The attenuator 2 is connected on the input side via two switches S1 to the input terminals 11b for feeding a differential input signal. It comprises a plurality of capacitors with different capacitance values arranged in parallel in two capacitor arrays 200 and 201. For example, the individual capacitors 202, 203 in each capacitance array are weighted in a binary manner with respect to their capacitance values. Therefore, binary attenuation or analog-digital conversion is possible.

On the output side, each capacitor 202, 203 of the two capacitance arrays 200 and 201 is connected to the comparator 100. In detail, the capacitors 202, 203 of the first capacitance value 200 are connected to a first comparator input and the capacitors of the second capacitance array 201 are connected to a second comparator input. Between the two comparator inputs is a switch S3. On the input side, the capacitors 202, 203 of the first capacitance array 200 are each connected to a switch S2_1P to S2_kP. The capacitors of the second capacitance array 201 are connected to corresponding switches S2_1N to S2_kN. The individual switches S2_1P to S2_kN are used to feed a positive or negative reference potential VREF or the respective input potential applied to the input terminals 11$b$ to the capacitors of the two capacitance arrays 200, 201. For controlling this high voltage-resistant switch, the signals S1_LV to S2_kP_LV output by the control unit 303 are used.

During operation, the converter according to the invention is clocked as a "sample and hold circuit." In a first phase, known as the sampling phase, the switch S1 and the switch S3 are closed. According to the selected level range, a few of the switches S2_1P to S2_kN are switched to the middle and thus connect the capacitors of the two capacitance arrays 200, 201 to the respective input terminals 11$b$.

The unused capacitors of the individual capacitance arrays 200, 201 are used as attenuators and are switched accordingly to positive or negative reference potential VREF. At the end of the sampling phase, the switch S3 and the switch S1 are opened and the switches S2_1P to S2_kN switched in the middle in the sampling phase are set to the respective positive or negative reference potential VREF. The comparison circuit 100 now generates a digital output signal DOUT from the difference in the input voltage sampled in the first phase and the reference voltage. This is fed to the logic circuit 1$b$ for further processing.

Then the process is repeated until the necessary resolution is achieved for generating the digital data word.

In the construction of the attenuator 2 with the two capacitance arrays 200, 201 it is possible to attenuate the input signal through a corresponding suitable connection of the individual capacitors in the two capacitance arrays, so that even high input voltage values can be processed by the comparator 100. For this purpose, the values of the capacitors 202-203 of the two capacitance arrays 200, 201 are binary-weighted. For large input voltages to be processed, only one part of the capacitors 202 is connected in the sampling phase to the input terminals 11$b$. In contrast, at small input voltages at which the converter already requires in the first stage a high sensitivity for a sufficiently precise conversion, all of the capacitors 202-203 of the two capacitance arrays are connected to the input terminals.

In order to sample different voltage ranges in the most efficient way possible, the individual capacitors 202, 203 can be switched on or off in parallel successively by means of the control signals S2_1P_LV to S2_KN_LV. The control is here performed in the "Auto Range Logic" 42 integrated in the converter by evaluation of the digital output word "ADC OUT" output by the circuits of the successive approximation logic. If this exceeds a threshold, for example, over a longer time period, then the "Auto Range Logic" 42 generates a signal "Busy" and outputs this as the output. In this way, external circuits are informed that a range adjustment of the converter is now being performed. Simultaneously, it generates several control signals "Switch Control" and feeds them to the control circuit 303 for the adjustment of the capacitors. In addition, the "Auto Range Logic" 42 identifies an overload of the converter and outputs an overload signal "Overload" at the corresponding output. In the same way, a range switch-over can be activated when the control circuit registers that the value falls below a second threshold over a longer time period. In this way, the converter is always operated in a working range of its greatest sensitivity and can also process a high voltage level at its input.

With the present invention, an analog-digital converter arrangement is realized in which the A/D converter 1 is used simultaneously as a measurement instrument for the detection of an average maximum level. This is used for setting a programmable attenuator connected before the converter. Through suitable dynamic readjustment both for an input signal higher than the processing range of the converter and also for an input signal lower than a lower threshold, a dynamic readjustment of the attenuator can be performed. In this way, the analog-digital converter of the entire device is always operated in an optimum control range. At the same time, additional detection by the level detector is not required, whereby the overall power consumption of the arrangement is reduced.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An adjustable analog-digital converter arrangement comprising:
   an input adapted for receiving an input signal;
   an analog-digital converter operating by successive approximation, having a signal input coupled with the input, wherein said converter is adapted for converting an analog signal at the signal input into a digital value;
   an attenuator with an output, wherein an input of said attenuator is coupled to the signal input and is adapted for an amplitude change of signals applied to its input, wherein the amplitude change is controllable by means of a control input, and wherein the attenuator comprises switchable capacitors configured to attenuate the input signal during sampling of the input signal at the signal input and forms a part of a first stage of said analog-digital converter; and
   a control circuit having an output coupled to the control input of the attenuator and adapted to initialize, as a function of a comparison of a signal output by the analog-digital converter with a threshold, an automatic adjustment of the attenuation by generating a control signal, and having an output for the output of the control signal that is coupled to the attenuator.

2. The analog-digital converter arrangement according to claim 1, wherein the analog-digital converter includes an overflow output for the output of an overflow signal when an amplitude of the analog signal on the signal input that is greater than a first threshold value is detected, wherein the overflow output is coupled to the control circuit.

3. The analog-digital converter arrangement according to claim 2, wherein the first and/or the second threshold values specify a maximum permissible input signal level of the analog-digital converter.

4. The analog-digital converter arrangement according to claim 1, wherein the control circuit is adapted for generating the control signal as a function of a comparison of the digital value output by the analog-digital converter with a second threshold value.

5. The analog-digital converter arrangement according to claims 1, wherein the attenuator comprises a controllable voltage divider network comprising at least two capacitors adapted to be connected in series or in parallel.

6. The analog-digital converter arrangement according to claim 5, wherein the at least two capacitors have the same capacitance values or capacitance values that differ by a factor of 2.

7. The analog-digital converter arrangement according to claim 1, wherein the attenuator comprises at least one capacitor with adjustable capacitance.

8. The analog-digital converter arrangement according to claim 1, wherein the attenuator comprises an amplifier with adjustable amplification.

9. The analog-digital converter arrangement according to claim 1, further comprising a reference potential terminal that is coupled by means of a respective switch with a first terminal of a respective capacitor of the attenuator and the respective second terminals of the capacitors of the attenuator are coupled to the output of the attenuator.

10. The analog-digital converter arrangement according to claim 9, wherein capacitors of the attenuator that are not connected in the signal path are connected to the reference potential terminal, which is also temporarily coupled with the capacitors of the attenuator connected in the signal path during a successive approximation of the analog-digital converter arrangement.

11. The analog-digital converter arrangement according to claim 1, wherein the analog-digital converter comprises a first stage and at least one second stage.

12. The analog-digital converter arrangement according to claim 1, wherein the analog-digital converter comprises a comparator having an input coupled to the attenuator for the output of an evaluation signal.

13. The analog-digital converter arrangement according to claim 1, wherein the attenuator is constructed with voltage-resistant switches for adjusting its attenuation factor.

14. The analog-digital converter arrangement according to claim 1, wherein the control circuit has a control input for feeding a range adjustment signal for an initialization of a change in amplitude of the attenuator.

15. The analog-digital converter arrangement according to claim 1, further comprising an interface that is connected to the control circuit and by means of which this control circuit provides the digital value of the analog-digital converter and at least the overflow signal.

16. A method for analog-digital conversion comprising the steps of:
providing an analog signal with a signal level;
providing an analog-digital converter with an input signal range;
feeding the analog signal to the analog-digital converter;
determining an amplitude of the fed analog signal by the analog-digital converter;
generating an overflow signal as a function of a comparison of the determined amplitude with at least one threshold value;
initializing an automatic range adjustment in which a capacitive attenuator is changed in response to the overflow signal;
changing the signal level of the analog signal as a function of the determined amplitude through capacitive attenuation of the analog signal by means of the capacitive attenuator; and
converting the fed signal into a digital value.

17. The method according to claim 16, wherein the step of determining comprises the steps of:
multiple sampling of the amplitude of the fed signal in the converter over a first time period, and
determining a maximum amplitude of the fed signal.

18. The method according to claim 16, wherein step of generating an overflow signal comprises at least one of the steps of:
determining whether the determined amplitude is greater than a first threshold value, and
determining whether the determined amplitude is less than a second threshold value.

19. The method according to claim 16, wherein the step of changing the signal level comprises at least one of the steps of:
changing the signal level by successive approximation steps;
attenuating the signal level by a maximum possible factor;
attenuating the signal level by a predetermined fixed value;
amplifying the signal level by a predetermined fixed value; and
amplifying the signal level by a value that is derived from a difference from the determined amplitude and the input signal range of the converter.

20. The method of claim 16, wherein a display signal is generated during the steps of determining an amplitude and of changing the signal level.

21. The method according to claim 16, wherein the steps of initialization are initialized by a control signal that is fed as an external control signal.

22. An adjustable analog-digital converter arrangement comprising:
an input adapted for receiving an input signal;
an analog-digital converter operating by successive approximation, having a signal input coupled with the input, wherein said converter is adapted for converting an analog signal at the signal input into a digital value;
an attenuator with an output, wherein an input of said attenuator is coupled to the signal input and is adapted for an amplitude change of signals applied to its input, wherein the amplitude change is controllable by means of a control input, and wherein the attenuator comprises switchable capacitors configured to attenuate the input signal during sampling of the input signal at the signal input and forms a part of a first stage of said analog-digital converter;
a control circuit having an output coupled to the control input of the attenuator and adapted to initialize, as a function of a comparison of a signal output by the analog-digital converter with a threshold, an automatic adjustment of the attenuation by generating a control signal, and having an output for the output of the control signal that is coupled to the attenuator; and
a reference potential terminal that is coupled by means of a respective switch with a first terminal of a respective capacitor of the attenuator and the respective second terminals of the capacitors of the attenuator are coupled to the output of the attenuator.

23. The analog-digital converter arrangement according to claim 22, wherein capacitors of the attenuator that are not connected in the signal path are connected to the reference potential terminal, which is also temporarily coupled with the capacitors of the attenuator connected in the signal path during a successive approximation of the analog-digital converter arrangement.

24. An adjustable analog-digital converter arrangement comprising:
- an input adapted for receiving an input signal;
- an analog-digital converter operating by successive approximation, having a signal input coupled with the input, wherein said converter is adapted for converting an analog signal at the signal input into a digital value;
- an attenuator with an output, wherein an input of said attenuator is coupled to the signal input and is adapted for an amplitude change of signals applied to its input, wherein the amplitude change is controllable by means of a control input, and wherein the attenuator comprises switchable capacitors configured to attenuate the input signal during sampling of the input signal at the signal input and forms a part of a first stage of said analog-digital converter; and
- a control circuit having an output coupled to the control input of the attenuator and adapted to initialize, as a function of a comparison of a signal output by the analog-digital converter with a threshold, an automatic adjustment of the attenuation by generating a control signal, and having an output for the output of the control signal that is coupled to the attenuator,
- wherein the analog-digital converter comprises a comparator having an input coupled to the attenuator for the output of an evaluation signal.

25. An adjustable analog-digital converter arrangement comprising:
- an input adapted for receiving an input signal;
- an analog-digital converter operating by successive approximation, having a signal input coupled with the input, wherein said converter is adapted for converting an analog signal at the signal input into a digital value;
- an attenuator with an output, wherein an input of said attenuator is coupled to the signal input and is adapted for an amplitude change of signals applied to its input, wherein the amplitude change is controllable by means of a control input, and wherein the attenuator comprises switchable capacitors and forms a part of a first stage of said analog-digital converter; and
- a control circuit having an output coupled to the control input of the attenuator and adapted to initialize, as a function of a comparison of a signal output by the analog-digital converter with a threshold, an automatic adjustment of the attenuation by generating a control signal, and having an output for the output of the control signal that is coupled to the attenuator,
- wherein the control circuit has a control input for feeding a range adjustment signal for an initialization of a change in amplitude of the attenuator.

* * * * *